US007358026B2

(12) United States Patent
Dudek et al.

(10) Patent No.: US 7,358,026 B2
(45) Date of Patent: Apr. 15, 2008

(54) METHOD FOR THERMAL DEVELOPMENT OF A PHOTOSENSITIVE ELEMENT USING A DEVELOPMENT MEDIUM HAVING A SUPPORT

(75) Inventors: Dietmar Dudek, Langen (DE); Mark A. Hackler, Ocean, NJ (US); Robert A. McMillen, Downingtown, PA (US); Allan Banke, Nyborg (DK)

(73) Assignee: E. I. du Pont de Nemours and Company, Wilmington, DE (US)

( * ) Notice: Subject to any disclaimer, the term of this patent is extended or adjusted under 35 U.S.C. 154(b) by 6 days.

(21) Appl. No.: 11/227,520

(22) Filed: Sep. 15, 2005

(65) Prior Publication Data

US 2007/0059642 A1    Mar. 15, 2007

(51) Int. Cl.
*G03F 7/34* (2006.01)
*B44C 1/165* (2006.01)

(52) U.S. Cl. ............ 430/254; 430/306; 430/325; 430/330; 156/234

(58) Field of Classification Search ............ 430/254, 430/306, 325, 330, 17; 156/234
See application file for complete search history.

(56) References Cited

U.S. PATENT DOCUMENTS

| 3,060,023 A | 10/1962 | Burg et al. |
| 3,060,026 A | 10/1962 | Heiart |
| 3,264,103 A | 8/1966 | Cohen |
| 4,323,636 A | 4/1982 | Chen |
| 4,323,637 A | 4/1982 | Chen et al. |
| 4,427,759 A | 1/1984 | Gruetzmacher et al. |
| 4,460,675 A | 7/1984 | Gruetzmacher et al. |
| 4,726,877 A | 2/1988 | Fryd et al. |
| 4,753,865 A | 6/1988 | Fryd et al. |
| 5,015,556 A | 5/1991 | Martens |
| 5,175,072 A | 12/1992 | Martens |
| 5,215,859 A | 6/1993 | Martens |
| 5,262,275 A | 11/1993 | Fan |
| 5,279,697 A | 1/1994 | Peterson et al. |
| 5,506,086 A | 4/1996 | Van Zoeren |
| 5,607,814 A | 3/1997 | Fan et al. |
| 5,719,009 A | 2/1998 | Fan |
| 5,766,819 A | 6/1998 | Blanchet-Fincher |
| 5,840,463 A | 11/1998 | Blanchet-Fincher |
| 6,797,454 B1 | 9/2004 | Johnson et al. |
| 2006/0292495 A1* | 12/2006 | Roshelli et al. ............ 430/302 |

FOREIGN PATENT DOCUMENTS

| EP | 0 741 330 A1 | 11/1996 |
| JP | 53(1978)-8655 | 1/1978 |
| WO | WO 98/13730 A1 | 4/1998 |

OTHER PUBLICATIONS

U.S. Appl. No. 60/627,222, filed Nov. 12, 2004, Dietmar Dudek.
Marks' Standard Handbook for Mechanical Engineers, EDS. Avalone, E. and Baumeister III, T., 9TH Edition, Chapter 5, McGraw Hill, 1987 (Book not supplied).

* cited by examiner

*Primary Examiner*—Richard L. Schilling
(74) *Attorney, Agent, or Firm*—Thomas H. Magee

(57) ABSTRACT

This invention relates to a method for thermally developing a photosensitive element to form a relief pattern. The method includes heating a composition layer of the element to cause a portion of the layer to liquefy and providing a development medium under tension to the element to absorb the liquefied composition. The development medium includes an absorbent material and a support, the combination of which minimizes stretch and distortion of the absorbent material and can impede the migration of the liquefied composition through the absorbent material.

48 Claims, No Drawings

METHOD FOR THERMAL DEVELOPMENT OF A PHOTOSENSITIVE ELEMENT USING A DEVELOPMENT MEDIUM HAVING A SUPPORT

BACKGROUND OF THE INVENTION

1. Field of the Invention

This invention pertains to a method for thermally developing a photosensitive element, and particularly to a method that includes heating the element to cause a portion of a composition layer to liquefy, and providing a development medium comprising a support and an absorbent material in contact with the element to remove the liquefied material.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, photopolymerization of the photopolymerizable layer occurs in the exposed areas, thereby curing and rendering insoluble the exposed areas of the layer. Conventionally, the element is treated with a suitable solution, e.g., solvent or aqueous-based washout, to remove the unexposed areas of the photopolymerizable layer leaving a printing relief which can be used for flexographic printing. However, developing systems that treat the element with a solution are time consuming since drying for an extended period (0.5 to 24 hours) is necessary to remove absorbed developer solution.

As an alternative to solution development, a "dry" thermal development process may be used which removes the unexposed areas without the subsequent time-consuming drying step. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,060,023 (Burg et al.); U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is do not soften or melt, at the softening temperature for the unexposed portions. The absorbent material collects the softened un-irradiated material and then is removed from the photosensitive layer. The cycle of heating and contacting the photosensitive layer may need to be repeated several times in order to sufficiently remove the flowable composition from the un-irradiated areas and form a relief structure suitable for printing. After such processing, there remains a raised relief structure of irradiated, hardened composition that represents the irradiated image.

U.S. Pat. No. 3,060,023 describes a dry thermal image reproduction process for transferring images from photopolymerized image-bearing elements to a receptor surface. The type of receptor support is dependent on the desired use for the transferred image and on the adhesion of the image to the base. Disclosed receptor supports include paper; cardboard; metal sheets, foils, and meshes; wood; glass; nylon; rubber; polyethylene; linear condensation polymers such as the polyesters, e.g., polyethylene terephthalate; silk, cotton, and rayon fabrics or screens. The receptor supports were used in sheet form. The process can be used to prepare relief images ranging in depth from a fraction of a mil up to 10 mils or more by thermal transfer of the unexposed areas of the photopolymerizable stratum. The purpose of the process is to reproduce the transferred image on the receptor to provide at least one duplicate copy of the original image. Example IV describes transfer of an image to a receptor support made of a fine mesh screen of silk mounted on a wooden frame and supported by a firm aluminum sheet.

Processors for thermal development of flexographic printing elements are known. U.S. Pat. No. 5,279,697 and U.S. Pat. No. 6,797,454 each describe an automated process and apparatus for handling an irradiated printing element and accomplishing repeated heating and pressing to remove the unirradiated composition from the element with a web of absorbent material. The apparatus includes a hot roll that delivers the absorbent material to the photosensitive element. Heat is transferred by conduction from the hot roll, through the absorbent web, to the photosensitive element upon contact at a nip so the temperature of the composition layer is raised sufficiently to enable the unirradiated portions of the composition layer to liquefy. The absorbent web is pressed against the photosensitive element to absorb the liquefied unirradiated composition and then is separated from the element A problem sometimes arises during thermal development where the absorbent material is a continuous web, and in particular, a web of nonwoven material. After the absorbent material contacts the is photosensitive element and collects the softened unirradiated material, the web of absorbent material can stretch and/or distort while being separated from the photosensitive element. The adhesion or the ability to separate the absorbent web from the element varies with the relief image forming. Portions of the relief image that are polymerized and therefore less tacky, peel easily as the web separates. Whereas the absorbent web may adhere and peel after the nip in portions of the relief image that are unpolymerized and thus are tacky or molten polymer. At times, the web adheres to the photosensitive element to such an extent that the can web stretch and/or distort while being separated or peeled from the element. Forces associated with the peeling of the web from the element change when the web stretches and/or distorts, which can induce defects into the element such as waves, variations in relief formation, etc. Printing with printing forms having variations in relief can be a problem particularly for high quality printing as areas with shallow relief can accumulate dirt that ultimately prints on the substrate, and relief areas that are too deep can weaken fine printing elements such as highlight dots and fine lines.

The stretching and/or distorting web can adhere to the photosensitive element to such an extent that the web can even cause the photosensitive element to lift from its support surface while being separated or peeled from the element. The removal of the absorbent web from the still warm photosensitive element can induce defects in the resulting relief element. Stretching and/or distorting of the web particularly while peeling, and the lifting of the photosensitive element while the element is still hot, can bend the element and induce strains in the structure of the element which create a defect, called waves, in the resulting relief element. The non-uniform strains imparted in the element while the support is at a temperature higher than the glass transition temperature result in deformations that remain after the element has cooled or returned to room temperature. The deformations are waves of localized distortions resulting in a non-planar topography of the photosensitive element. Because of the uncontrolled nature of the web in thermal development of the prior art, waves of distortions can form in different locations in each element processed.

Relief printing forms having waves result in poor print performance. In multicolor printing, when one or more of the relief printing forms have waves the printed image has poor registration. Even in single color printing, waves in the relief printing form may print an image that is not an accurate reproduction of its original, so called image infidelity, by printing straight lines as curves for example. Further, the relief printing form having waves may incompletely print the image due to intermittent contact of the inked surface of the printing form to the printed substrate.

Further, the web may stretch and remain in contact with the photosensitive element for a sufficient time that the molten polymer starts to cool. Removal of the web while the element is cooling can change the cohesive and adhesive forces between the web and the relief surface of the photosensitive element. As such the relief surface may clean out, that is, remove unpolymerized polymer, differently than if the web is removed while the element is hot when directly in or immediately after the nip. Removal of the web while the element is cooling can lead to stripwise (across the web) artifacts in the relief surface such as dot size variations or variation in the quality and cleanliness of sidewalls of dots, that print as density variations.

Stretching or distortion of the continuous web during separation from the element can create other problems. Web tension changes as the web stretches. Controlling the velocity of the web can be more difficult since web velocity varies through the process due to the stretching of the web. The web may even break from extensive stretching or distortion. In this case, the web would not be present to remove the tacky molten polymer from the heated photosensitive element, and the polymer can flow onto various surfaces in the processor including the hot roll and the drum support roll. As such operations are suspended for a considerable downtime while the web is re-threaded through the processor and the tacky molten polymer is removed from various interior surfaces. If the molten polymer remains on the hot roll, the polymer tends to build up and harden on the roll, which can then impress patterns into the surface of subsequently processed printing forms.

It is thus desirable to provide a method for thermal development using a continuous web of the development medium that does not stretch, distort, or break. It is also desirable to provide a method for thermal development using a continuous web of the development medium that allows for relatively high tension in the web and more controlled separation of the web from the photosensitive element.

SUMMARY OF THE INVENTION

The present invention provides a method for forming a relief pattern from a photosensitive element having an exterior surface and containing a composition layer capable of being partially liquefied. The method comprises: heating the exterior surface to a temperature sufficient to cause a portion of the layer to liquefy; providing a development medium to the exterior surface, the development medium comprising an absorbent material that contacts the exterior surface and is under tension in a direction parallel to the exterior surface; and pressing the development medium and the exterior surface into contact at a pressure sufficient for at least a portion of the liquefied material to be removed by the absorbent material. The development medium further comprises a support adjacent the absorbent material and opposite the exterior surface.

DESCRIPTION OF THE PREFERRED EMBODIMENT(S)

The present invention is a method for thermally developing a photosensitive element, preferably to form a flexographic printing plate. The present invention contemplates a method capable of heating a photosensitive element having a layer of composition capable of being partially liquefied to a temperature sufficient to melt or soften or liquefy at least a portion of the layer for any purpose. In particular, the present invention relates to method for thermally developing the photosensitive element using a development medium having an absorbent material and a support adjacent the absorbent material. The presence of the support in the development medium stabilizes the absorbent material from stretching and/or distortion, particularly while the absorbent material is under tension. Also, the presence of the support in the development medium may impede the migration of the liquefied composition through the absorbent material.

Thermal development heats the photosensitive element to a development temperature that causes uncured portions of the composition layer to liquefy, i.e., melt or soften or flow, and be removed or carried away by contact with the absorbent material of the development medium. The development medium may also be referred to herein as development material, development web, and web. The absorbent material may also be referred to herein as absorbent medium, absorbent web, and absorbent layer. Cured portions of the photosensitive layer have a higher melting or softening or liquefying temperature than the uncured portions and therefore do not melt, soften, or flow at the thermal development temperatures. Thermal development of photosensitive elements to form flexographic printing plates is described in U.S. Pat. No. 5,015,556; U.S. Pat. No. 5,175,072; U.S. Pat. No. 5,215,859; and WO 98/13730. The photosensitive element includes a substrate and at least a composition layer mounted on the substrate. The composition layer is capable of being partially liquefied.

The term "melt" is used to describe the behavior of the unirradiated portions of the composition layer subjected to an elevated temperature that softens and reduces the viscosity to permit absorption by the absorbent material. The material of the meltable portion of the composition layer is usually a viscoelastic material which does not have a sharp transition between a solid and a liquid, so the process functions to absorb the heated composition layer at any temperature above some threshold for absorption in the development medium. Thus, the unirradiated portions of the composition layer soften or liquefy when subjected to an elevated temperature. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The use of the term absorption in defining the relative physical property between the absorbent material of the development medium and the melted uncured elastomeric composition is not intended to be limited to particular absorptive phenomena. There need not be penetration of the melted composition into the body of fibers, filaments or particles used for the absorbent material. The absorption into the bulk of the absorbent material may be only by surface wetting of the interior bulk. The driving force for the movement of the melted elastomeric composition into the absorptive areas of the development medium may be one or more of surface tension, electrical forces, polarity attraction or other physical forces known to assist in promoting philicity (that is, an affinity for), adsorption, or absorption of materials. The driving force may also include pressure driven flow into a porous media.

The development medium includes the absorbent material that is selected to have a melt temperature exceeding the melt or softening or liquefying temperature of the unirradiated or uncured portions of the radiation curable composition and having good tear resistance at the same operating temperatures. Preferably, the absorbent material withstands temperatures required to process the photosensitive element during heating. The absorbent material is selected from non-woven materials, paper stocks, fibrous woven materials, open-celled foams, porous materials that contain a fraction or a substantial fraction of their included volume as void volume. The absorbent material is typically a continuous web, but can be in sheet form. The absorbent material should also possess a high absorbency for the molten elastomeric composition as measured by the grams of elastomer that can be absorbed per square millimeter of the absorbent medium. It is also desirable that fibers are bonded in absorbent medium so that the fibers are not deposited into the printing form during development. Preferred for the absorbent material are non-woven webs of nylon or polyester. The absorbent material has a thickness between 2 to 25 mils (0.005 to 0.064 cm), preferably 2 to 20 mils (0.005 to 0.051 cm), and most preferably 4 to 15 mils (0.010 to 0.038 cm).

The development medium includes the support adjacent to the absorbent material and opposite the exterior surface of the photosensitive IS element. The support is selected to be tear resistant and heat resistant, that is, having a melt temperature exceeding the melt or softening or liquefying temperature of the unirradiated or uncured portions of the radiation curable composition. The support is selected so that when combined with the absorbent material, the combination has improved mechanical properties to better withstand the rigors of thermal processing than the mechanical properties of the absorbent material alone. It is preferred that the support also be non-porous or at least non-absorbing so as to prevent migration of the molten polymer from the absorbent material through to underlying structures, i.e., contact member, in the apparatus. A support that is only slightly or completely porous or absorbing of the polymeric melt may still be suitable in the present invention to stabilize the absorbent material from stretching and/or distorting. A slightly or completely porous or absorbing support may still provide some barrier functionality to the development medium, depending upon characteristics of the support material such as, for example, density of fibers, fiber diameter, pore size, support thickness, and heat resistant coating/s. The support is not limited and can be selected from polymeric films, paper, metals, fabrics, nonwovens, and combinations thereof. Examples of suitable combinations include metalized polymeric films, and fabrics with non-wovens. The support can be almost any polymeric material that forms films that are non-reactive and remain stable throughout the processing conditions. Examples of suitable film supports include cellulosic films and thermoplastic materials such as polyolefins, polycarbonates, and polyester. Preferred are films of polyethylene terephthalate and polyethylene naphthalate. Examples of metals suitable as the support include aluminum, nickel, and steel. There can be some overlap of materials suitable as the absorbent material and as the support, such as papers, fabrics, and nonwovens, due to the plethora of materials available that may have the characteristics suitable to function as the absorbent material and as the support. For instance, a variety of paper stocks are available with different strengths and porosities, such that some have suitable porosity to function as the absorbent material and others have suitable mechanical strength to function as the support. The support can be in sheet form or a continuous web, but is preferably in the same form as the absorbent material. The thickness of the support is not particularly limited, provided that the support has sufficient strength to minimize or reduce stretch and/or distortion of the absorbent material and does not unduly influence heat transfer from the contact member, e.g., hot roll, through the development medium. A preferred thickness for the support is between about 0.01 mm and about 0.38 mm (0.4-15 mils).

The presence of the support with the absorbent material in the development medium of the present invention improves the mechanical properties, in particular modulus of elasticity and yield point, of the absorbent material alone and thereby provides enhanced performance and operation of the thermal development process, and quality in the resulting print element. The modulus of elasticity is a ratio of an increment of stress to an increment of strain. For the present invention the modulus of elasticity is the Young's modulus where at low strains the relationship between stress and strain is linear, such that a material can recover from stress and strain. The modulus of elasticity may also be referred to as coefficient of elasticity, elasticity modulus, or elastic modulus. The yield point is the stress point where the relationship between applied stress and strain deviates from the linear relationship associated with Young's modulus. At the yield point, material no longer recovers from induced stress and strain, and exhibits permanent plastic deformation. The yield point may also be referred to as yield strength. Typically for the materials used in the present invention the break point is beyond the yield point.

The modulus of elasticity and the yield point are mechanical properties well known to those of ordinary skill. A description of these and other mechanical properties of materials, and analysis thereof, can be found in *Marks' Standard Handbook for Mechanical Engineers*, eds. Avalone, E. and Baumeister III, T., $9^{th}$ edition, Chapter 5, McGraw Hill, 1987. A suitable method for determining the modulus of elasticity and the yield point of the development medium and absorbent material is by standard test method ASTM D5035.

The development medium has a modulus of elasticity that is sufficient to minimize stretch and/or distortion of the absorbent material while the absorbent material is under tension. The modulus of elasticity of the combination of the absorbent material and the support as the development medium is greater than the modulus of elasticity of the absorbent material alone. Depending upon the selection of materials used for the support and the absorbent medium, the development medium can have a modulus of elasticity that is at least 10% greater than the modulus of elasticity for the absorbent medium alone. At room temperature, the modulus of elasticity for the development medium can increase at least 10%, preferably at least 15%, more preferably 25% to as much as two fold (2×) or more of the modulus of elasticity of the absorbent material alone. The magnitude of improvement in the modulus of elasticity for the development medium may be less at the temperatures associated with thermal development. But in general an improvement in the modulus of elasticity for the development medium (over the modulus of elasticity alone) should still occur at thermal development temperatures. The yield point of the development medium is sufficient so as to reduce the tendency of the absorbent material to break particularly during thermal development. Similarly, the yield point of the combination of the absorbent material and the support as the development medium is greater than the yield point of the absorbent material alone. Depending upon the selection of materials used for the support and the absorbent medium, the development medium can have a yield point that is at least 10% greater than the yield point for the absorbent material alone. The yield point for the development medium can increase preferably at least 15%, more preferably 40% or more, than the yield point of the absorbent material alone.

In one embodiment of the invention, the development medium comprises the absorbent material and the support. The absorbent material and the support may be brought together to form the development medium prior to or during the thermal development process. The absorbent material and the support may form a monolithic structure by, for example, lamination under pressure and/or heat, to form the development medium, independent from the thermal development process. Alternatively, the absorbent material and the support may be bonded together during manufacture of a nonwoven absorbent medium by, for example, ultrasonic welding, or use of a suitable adhesive. In yet another alternative method, the absorbent material and the support may be assembled to form the development medium during thermal development, for example, prior to or during the pressing step. During thermal development, the absorbent material and the support may each be independently supplied to a nip where the development medium contacts the exterior surface of the photosensitive element. In this case, the support and the absorbent material are together at least during the period when the greatest stress is induced on the tensioned absorbent material, that is, during contact of the absorbent material to the photosensitive element and separation of the development medium from the photosensitive element. The presence of the support with the absorbent material during at least this period is sufficient to minimize stretch or distortion of the absorbent material. In effect, the absorbent material and the support can thus be secured or laminated together by transporting through the nip during thermal development of the element. The molten polymer that was removed by the absorbent material may function like an adhesive to adhere the absorbent material and the support together, particularly if the removed molten polymer is allowed to cool. Alternately during thermal development, the absorbent material and the support may each be independently supplied to a location prior to the nip where the absorbent material and the support are united to form the development medium. After the development medium contacts and separates from the photosensitive element, the absorbent material and the support may be collected as one web on a take-up roll. It is also contemplated that the independent webs of absorbent material and support, while together during contact to and separation from the photosensitive element, may then be separated and independently collected on their own take-up roll. In yet another embodiment, the support is formed into a continuous belt that wraps about a contact member, e.g., the hot roll, and a second roller, and the absorbent material is independently supplied to the exterior surface. In this embodiment, the support and absorbent material are together during the critical stress/strain period induced on the absorbent material, but the support belt would separate from the absorbent material (after the absorbent material separated from the element) and continually traverse about the contact member and the second roller.

Another embodiment of the development medium comprises a first absorbent material and a second absorbent material with the support in between the first and second absorbent materials. This embodiment of the development medium could be formed similarly to the embodiment described above. An advantage of this particular embodiment is that condensate that is formed by heating the photosensitive element during thermal development could be directed to the second absorbent material, as the first absorbent material removes the liquefied portions from the element.

The absorbent material and/or the support may include an adhesive or an adhesion layer or may be treated to promote adhesion or attraction of the absorbent material to the support. The type of adhesive used is not limited, provided that the adhesive can withstand thermal development conditions. For example, a two component polyurethane may be suitable as the adhesive.

The development medium is oriented in the thermal development apparatus such that the absorbent material contacts the exterior surface of the photosensitive element and the support is adjacent the absorbent material opposite the exterior surface. In a preferred embodiment the support will be between the absorbent material and a contact member that supports and/or presses the development medium in contact with the element. In this embodiment, a side of the support opposite the absorbent material will reside on the contact member. The absorbent material is under tension in a direction parallel or substantially parallel to the exterior surface of the photosensitive element and contacts the exterior surface of the photosensitive element to remove at least a portion of the liquefied material of the composition layer. If the absorbent material and the support are united offline to form the development medium, both the absorbent material and the support, i.e., the development medium, are under tension in a direction parallel or substantially parallel to the exterior surface.

The present invention is a method for forming a relief pattern from a photosensitive element where the development medium includes a support that minimizes or reduces stretch or distortion of the absorbent material while the absorbent material contacts the exterior surface of the photosensitive element. Advantageously, the presence of the support with the absorbent medium allows for more uniform separation of the development medium after contact, which in turn reduces wave deformations in the resulting printing form. Additionally, the presence of the support with the absorbent material forms a development medium that does not excessively stretch or break, and thus provides improved productivity for the thermal development apparatus. Further, the presence of the support with the absorbent medium can prevent tacky molten polymer from migrating through the absorbent material and contaminating the surface of the contact member, e.g. hot roll. Surprisingly and unexpectedly, the presence of the support with the absorbent medium can also provide improved relief structure for the resulting printing form. Printing forms prepared by the present invention have deeper relief, and in some cases, less difference between open floor areas and more critical or obstructed areas.

An apparatus suitable for thermally developing the photosensitive element is disclosed by Peterson et al. in U.S. Pat. No. 5,279,697, and by Johnson et al. in U.S. Pat. No. 6,797,454 B1. The photosensitive element in all embodiments is in the form of a plate. Another apparatus suitable for thermally developing a cylindrically-shaped photosensitive element is described in to U.S. provisional patent application Ser. No. 60/627222 filed Nov. 12, 2004 (attorney docket number GP-1212). However, it should be understood that one of ordinary skill in the art could modify each of the above apparatuses to accommodate the present inventive method for forming a relief pattern using the development medium comprising the absorbent material and the support.

In the present invention, thermal development includes heating of an exterior surface of the composition layer of the photosensitive element to a temperature sufficient to cause a portion of the layer to liquefy. The at least one photosensitive layer (and additional layer/s if present) can be heated by conduction, convection, radiation or other heating methods to a temperature sufficient to effect melting of the uncured portions but not so high as to effect distortion of the cured portions of the layer. One or more additional layers disposed above the composition layer may soften or melt or flow and be removed as well by the absorbent material of the development medium. The photosensitive element is heated to a surface temperature above about 40° C., preferably from about 40° C. to about 230° C. (104-446° F.) in order to effect melting or flowing of the uncured portions of the composition layer. The thermal treating steps of heating the photosensitive element and contacting the absorbent material of the development medium to an exterior surface of the element can be done at the same time, or in sequence provided that the uncured portions of the photopolymerizable layer are still soft or in a melt state when contacted with the development medium. By maintaining more or less intimate contact of the development medium with the composition layer that is molten in the uncured regions, a transfer of the uncured photosensitive material from the photopolymerizable layer, i.e., partially liquefied portions, to the absorbent material of the development medium takes place. Intimate contact of the development medium to the photopolymerizable layer may be maintained by the pressing the layer and the development medium together.

The exterior surface of the photosensitive element can be heated by one or more sources in the thermal development apparatus. Independently or in any combination, the sources for heating are capable of heating the exterior surface of the photosensitive element to a temperature sufficient to cause a portion, i.e., an unirradiated portion, of the composition layer to at least partially liquefy. The method for heating each of the sources are not limited and can include, for example, an electrical core heater, electric heating blanket, steam, oil, hot air, and other heating sources that can provide a temperature sufficient to maintain or elevate the temperature of the exterior surface to melt a portion of the composition layer.

A preferred heating source is the contact member that heats the exterior surface of the composition layer while supplying the development medium to the element. Heat is transferred by conduction from the contact member through the development medium to the exterior surface of the element upon contact, raising the temperature of the element and causing the uncured portions of the composition layer of the element to melt, soften, or flow into the absorbent material of the development medium.

The processor may include another source for heating that is a focused radiant heater/s directed at the exterior surface of the photosensitive element. The radiant heater can apply all or a portion of the heat needed to the exterior surface of the composition layer, to elevate the temperature of the exterior surface of the composition layer sufficient to melt the unirradiated portion of the composition layer, causing a portion of the layer to liquefy. The heater can include one or a plurality of tubular infrared heating bulb/s mounted in end supports that also provide electrical connections to the bulb/s. The heater can also include a reflector adjacent to the bulb/s that acts to focus and direct the infrared radiation toward the exterior surface of the element.

The apparatus includes a base member (which may also be referred to as a second member) such as, a drum, multiple rolls (i.e., two or more rolls), an arcuate platform, and a planar surface, that supports the photosensitive element during thermal development. A preferred base member is a drum. The base member may include means for controlling a temperature of the outer surface of the base member, which helps to manage the thermal conditions experienced by the photosensitive element. In particular the means for controlling the temperature can be used to maintain the temperature of the support side of the photosensitive element. The means for controlling the base member temperature can include means for heating, means for cooling, and a combination thereof. The base member may be equipped with a heater, which is provided to keep the photosensitive element at a stable starting temperature independent of the surrounding environment. Any means of heating the base member is acceptable, as long as the power capacity of the heater is sufficient to maintain a fairly constant selected skin temperature on the outer surface of the base member. In this embodiment, the source for heating the base member is capable of providing a portion of the heat to elevate the temperature of the exterior surface of the composition layer sufficient to melt the unirradiated portion of the composition layer, causing a portion of the layer to liquefy. If the normal operating environment is carefully controlled to be at a constant temperature, the heater can be turned off or omitted from the apparatus. As is disclosed in U.S. Pat. No. 6,797, 454 B1, it is also possible that the base member be cooled by cooling means, such as, a blower directing a stream of air at the surface of the photosensitive element and the drum and/or by the circulating of cooling fluid beneath the surface of the base member to cool the element. It is also contemplated that a fluid, such as water, may be circulated beneath the surface of the base member to heat and or cool the element. The temperature of the outer surface of the base member is about 50 to 150° F. (10 to 65.6° C.), preferably 75 to 95° F. (23.9 to 35° C.).

The development medium is supplied to the exterior surface of the element with the contact member (which may also be referred to as a first member). The contact member has a cross-sectional shape that is not limited, and can include, for example, circular, semi-circular, elliptical, parabolic, arcuate including convex and concave surfaces, wedge, triangular, rectangular, and other polygonal shapes. The shape of the contact member can be symmetrical or asymmetrical. A cylindrically-shaped roll is a preferred contact member. Typically the contact member is heated, and thus may be referred to as a hot roll or hot roller. The contact member is positioned adjacent the photosensitive element that is supported by the base member, e.g., drum. When the development medium is provided in contact with the exterior surface of the photosensitive element, a nip is formed between the development medium supplied by the hot roll and the photosensitive element carried by the drum.

In most embodiments, the photosensitive element and the development medium should move at the same or substantially the same linear speed to accomplish thermal development. To maintain this level of movement between the development medium and the exterior surface of the photosensitive element, there has to be a substantial relative movement between the contact member and the development medium. Relative movement may be provided by moving the development medium, or moving the contact member, or moving both the development medium and the contact member. In one embodiment, the development medium is a continuous web that traverses a surface of the contact member that is in a fixed position relative to the exterior surface of the element for thermal development. In another embodiment, the development medium is a continuous web that traverses the surface of the contact member that is moved into one or more orientations during the contacting step of thermal development.

At least the absorbent material of the development medium is under tension in a direction parallel or substantially parallel to the direction of travel of the exterior surface of the element. The support of the development medium may also be under tension, which may be the same as or different from the tension experienced by the absorbent material. In most embodiments the absorbent material and the support will have a single tension applied to the combined structure. It should be understood that the development medium may be under tension control, velocity control, or a combination thereof for transport through the processor, but tension is still applied to the absorbent material of the development medium from at least the nip (where the development medium contacts the exterior surface) to the separation of the development medium from the photosensitive element. In one embodiment, tensioning means such as brakes are included on rollers on the supply side of the nip. The brakes provide tension on the development medium as the medium transports through the processor by a drive roller. The tension may vary slightly, particularly as the diameter of the supply roll changes. In another embodiment (not shown), a sensor can be provided for detecting the outside diameter of the supply roll. The sensor is a potentiometer having a voltage, which varies with pivotal position. The voltage output is sent to a magnetic particle brake mounted onto shaft of the supply roll that varies the torque output of the shaft. The magnetic particle brake and sensor together maintain a substantially constant tension on the development medium. The tension in the development medium is at least 0.1 lbs/in (0.2 Newtons/cm), and preferably at least 0.3 lbs/in (0.5 Newtons/cm). The tension in the development medium can be as high as desired provided that the tension is less than the tensile strength of the development medium, though it is highly desirable to minimize the distortion of the development medium by keeping the tension below its yield point. In one embodiment where the development medium is a continuous web of both the absorbent material and support, a suitable range of tension is from about 0.1 to 10 lbs/in (0.2 to 17.5 Newtons/cm), preferably 0.3 to 5 lbs/in (0.5 to 8.8 Newtons/cm), and in another embodiment 0.5 to 1.0 lbs/in (0.875 to 1.75 Newtons/cm).

In one embodiment, the development medium is a continuous web that is held in tension substantially throughout its path in the thermal development apparatus. The continuous web of the development medium is unwound from a supply roll, guided to and over a surface of the contact member, and wound up on a take up roll. The web may pass over one or more additional rolls from the supply roll to the contact member, e.g., hot roll, and may pass over one or more additional rolls from the hot roll to the take up roll. One or more of the additional rolls may guide, idle, and/or drive the web through the processor. Tension is applied to the web of the development medium in its path from the nip to the take-up roll as the web transports about a drive roll having an abrasive outer surface to prevent slippage of the web. A torque motor provides constant torque to the drive roll so as to apply a constant or substantially constant tension to the development medium web. The web contacts the abrasive outer surface of the drive roll and can loop over one or more idler rolls to aid in providing a substantially uniform tension to the web after the hot roll. The tension required to remove the web from the photosensitive element may change with each cycle or subsequent cycles of removing for a given photosensitive element. As such, a controller for the torque motor can adjust the torque so that the tension in the web is accordingly changed. In one embodiment, the torque motor will adjust the torque to increase the tension required to remove the web from the element with later cycles of web removal for a particular element.

Additional methods for applying tension to the web may be included as necessary to maintain tension in the web throughout its transport path. Downstream of the drive roll, the web may wrap about one or more of the additional rolls that include a braking mechanism to maintain web tension in its transport path from the drive roll to the take up roll. Similarly on the supply side, one or more of the additional rolls may also include a braking mechanism to maintain tension of the web in its transport path from the supply roll to the nip. The brake mechanism provides resistance (i.e., tension) to the supply roll to prevent the web from over dispensing during processing. In alternate embodiments, the brake mechanism and/or other additional methods for applying tension can be included with the supply roll and/or the take up roll. Other embodiments implementing constant or substantially constant tension of the web can be contemplated by those skilled in the art.

The tension of the web along its path can be the same or different in each region of the processor. In particular, the tension of the web from the supply roll to the nip, i.e., supply tension, can be different from the tension being maintained in the web by the drive roll after the nip, i.e., windup tension. In one embodiment when the development medium and the element are in contact at the nip, the supply tension of the web is higher than the windup tension of the web, preferably the supply tension is greater than 1.5 times the windup tension, and most preferably the supply tension is 2 times the windup tension.

In velocity control, development medium passes over the drive roller, which in a preferred embodiment is belt driven by a motor. In one embodiment, the motor is a variable speed motor. The motor is of a size, which will pull the development medium through the processor at a linear speed that is synchronized with a linear speed of the outer surfaces of the element on the drum, and the hot roller.

Photosensitive Element

The present invention is not limited to the type of element that is thermally processed. In one embodiment, the photosensitive element includes a flexible substrate and a composition layer mounted on the substrate. The composition layer is at least one layer on the substrate capable of being partially liquefied. Preferably, the photosensitive element is an elastomeric printing element suitable for use as a flexographic printing form. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems that are photopolymerizable, photocrosslinkable, or both. In cases where the composition layer comprises more than one photosensitive layer on the flexible substrate, the composition of each of the photosensitive layers can be the same or different from any of the other photosensitive layers.

The layer of the photosensitive composition is capable of partially liquefying upon thermal development. That is, during thermal development the uncured composition must soften or melt at a reasonable processing or developing temperature. At least the exterior surface of the composition layer is heated to a temperature sufficient to cause a portion of the layer to liquefy, soften or melt.

The photosensitive layer includes at least one monomer and a photoinitiator, and optionally a binder. The at least one monomer is an addition-polymerizable ethylenically unsaturated compound with at least one terminal ethylenic group. Monomers that can be used in the photosensitive layer are well known in the art and include monofunctional acrylates and methacrylates, multifunctional acrylates and methacrylates, and polyacryloyl oligomers. Further examples of monomers can be found in U.S. Pat. Nos. 4,323,636; 4,753,865; and 4,726,877. A mixture of monomers may be used.

The photoinitiator is a compound that generates free radicals upon exposure to actinic radiation. Any of the known classes of photoinitiators, particularly free radical photoinitiators may be used. Alternatively, the photoinitiator may be a mixture of compounds, one of which provides the free radicals when caused to do so by a sensitizer activated by radiation.

The optional binder is a preformed polymer that serves as a matrix for the monomer and photoinitiator prior to exposure and is a contributor to the physical properties of the photopolymer both before and after exposure. In one embodiment the optional binder is elastomeric. A non-limiting example of an elastomeric binder is an A-B-A type block copolymer, where A represents a nonelastomeric block, preferably a vinyl polymer and most preferably polystyrene, and B represents an elastomeric block, preferably polybutadiene or polyisoprene. Other suitable photosensitive elastomers that may be used include polyurethane elastomers, such as those described in U.S. Pat. Nos. 5,015,556 and 5,175,072. The monomer or mixture of monomers must be compatible with the binder to the extent that a clear, non-cloudy photosensitive layer is produced.

Additional additives to the photosensitive layer include colorants, processing aids, antioxidants, and antiozonants. Processing aids may be such things as low molecular weight polymers compatible with the elastomeric block copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

The photosensitive element may include one or more additional layers on the side of the photosensitive layer opposite the substrate. Examples of additional layers include, but are not limited to, a release layer, a capping layer, an elastomeric layer, a laser radiation-sensitive layer, an actinic radiation opaque layer, a barrier-layer, and combinations thereof. The one or more additional layers preferably are removable, in whole or in part, by contact with the development medium in the range of acceptable developing temperatures for the photosensitive element used. One or more of the additional other layers can cover or only partially cover the photosensitive composition layer. An example of an additional layer which only partially covers the photosensitive composition layer is a masking layer that is formed by imagewise application, e.g., ink jet application, of an actinic radiation blocking material or ink.

The release layer protects the surface of the composition layer and enables the easy removal of a mask used for the imagewise exposure of the photosensitive element. Materials suitable as the release layer are well known in the art. Suitable compositions for the capping layer and methods for forming the layer on the element are disclosed as elastomeric compositions in a multilayer cover element described in Gruetzmacher et al., U.S. Pat. Nos. 4,427,759 and 4,460,675. The elastomeric capping layer is similar to the photosensitive layer in that after imagewise exposure the elastomeric capping layer is at least partially removable by contact with an absorbent material in the range of acceptable temperatures for the photosensitive element used.

In one embodiment, the laser radiation sensitive layer is sensitive to infrared laser radiation, and thus may be identified as an infrared-sensitive layer. The laser radiation sensitive layer can be on the photosensitive layer, or on a barrier layer which is on the photosensitive layer, or on a temporary support which together with the photosensitive element form an assemblage. Infrared-sensitive layers and actinic radiation opaque layers are well known in the art. The infrared-sensitive layer can be ablated (i.e., vaporized or removed) from the photosensitive layer on the side opposite the flexible substrate by exposure to infrared laser radiation. Alternatively, when the photosensitive element forms an assemblage with the support carrying the infrared-sensitive layer, the infrared-sensitive layer can be transferred from the temporary support to the external surface (the side opposite the flexible substrate) of the photosensitive layer by exposure to infrared laser radiation. The infrared-sensitive layer can be used alone or with other layers, e.g., ejection layer, heating layer, etc.

The infrared-sensitive layer generally comprises an infrared-absorbing material, a radiation-opaque material, and an optional binder. Dark inorganic pigments, such as carbon black and graphite, generally function as both infrared-sensitive material and radiation-opaque material. The thickness of the infrared-sensitive layer should be in a range to optimize both sensitivity and opacity to actinic radiation (e.g., has an optical density of $\geq 2.5$). Such infrared-sensitive photoablative or phototransferable layer can be employed in digital direct-to-plate image technology in which the exposure by laser radiation removes or transfers the infrared-sensitive layer to form an in-situ mask on the photosensitive element. Suitable infrared-sensitive compositions, elements, and their preparation are disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463; and EP 0 741 330 A1. The infrared-sensitive layer preferably is removable by contact with an absorbent material in the range of acceptable developing temperatures for the photosensitive element used.

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The substrate is selected to be tear resistant and must have a fairly high melt point, for example, above the liquefying temperature of the composition layer formed on the substrate. The material for the substrate is not limited and can be selected from polymeric films, foams, fabrics, and metals such as aluminum and steel. The substrate can be almost any polymeric material that forms films that are non-reactive and remain stable throughout the processing conditions. Examples of suitable film supports include cellulosic films and thermoplastic materials such as polyolefins, polycarbonates, and polyester. The shape of the support is not limited. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. Multiple layered sleeves are also acceptable and may include an adhesive layer or tape between the layers of flexible material. The sleeve may also be made of non-transparent, actinic radiation blocking materials, such as nickel or glass epoxy. The sleeve typically has a wall thickness from 10 to 80 mils (0.025 to 0.203 cm) or more. Preferred wall thickness for the cylinder form is 10 to 40 mils (0.025 to 0.10 cm).

The substrate of the photosensitive element has a thickness of between about 0.01 mm and about 0.38 mm. The radiation curable composition layer is between about 0.35 mm and about 7.6 mm thick, with a preferred thickness of about 0.5 mm to 3.9 mm (20 to 155 mils).

The photosensitive element is prepared for thermal development by imagewise exposing the element to actinic radiation. After imagewise exposure, the photosensitive element contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed with the laser radiation sensitive layer on the composition layer, or other means known in the art. Imagewise exposure can be carried out in a vacuum frame or may be conducted in the presence of atmospheric oxygen. On exposure, the transparent areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes.

For direct-to-plate image formation as disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463 and EP 0 741 330 A1 the image-bearing mask is formed in-situ with the laser radiation sensitive layer using an infrared laser exposure engine. The imagewise laser exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element is then ready for heat development with the absorbent material to form a relief pattern.

An overall back exposure, a so-called backflash exposure, may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is thermally developed as described above to remove unpolymerized areas in the photopolymerizable layer and thereby form a relief image. The thermal development step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer.

After thermal development, the flexographic printing form may be post exposed and/or chemically or physically after-treated in any sequence to detackify the surface of the flexographic printing form.

EXAMPLES

In the following examples, CYREL® FAST thermal processor and CYREL® flexographic printing plates are all available from The DuPont Company (Wilmington, Del.).

The photosensitive elements tested in the following examples were CYREL® flexographic printing plates or forms which were exposed and thermally processed as described below. The plates or forms were blanket exposed through the support (backside exposure) and imagewise exposed through a phototool having a mask image, to ultraviolet radiation on a CYREL® exposure unit, prior to thermal development. The development medium used is described in the Examples below.

Example 1

The following example demonstrates the method of thermal development using a continuous web of a development medium under tension. The development medium includes a support sufficient to minimize or reduce stretch of the absorbent material. The support may be laminated to the absorbent material offline prior to thermal development, or contacted with the absorbent material during thermal development.

The photosensitive elements used were cylindrically-shaped photopolymeric blanks on a sleeve support having a 480 mm repeat length. The cylindrical photosensitive elements were exposed to actinic radiation (UV) through a digital mask for 12 minutes, prior to thermal development.

A polyester non-woven was used as the absorbent material. A polyethylene terephthalate film (PET) of 12 micron thickness was used as the support. For one experiment, the polyester nonwoven and the PET film were laminated together offline between two rollers at 70° C. A 2-part polyurethane adhesive (from Henkel Corp.; hardener type 6067, adhesive type 7768) was applied between the nonwoven and the polyester film just prior to lamination. In a second experiment, the polyester nonwoven and the polyester film were separately mounted in the apparatus, such that the nonwoven and the film were brought together and united to form the development medium at the nip utilizing the transferred uncured photopolymer as a glue.

A thermal development processor having a hot roller, infrared heater, and two means for supporting a cylindrically-shaped photosensitive element according to U.S. provisional patent application Ser. No. 60/627222 filed Nov. 12, 2004 was used to thermally process photosensitive elements. The means for supporting the cylindrically-shaped element included a roller and a platform member having a cross-sectional arcuate shape providing an arcuate outer surface. A compressible adapter sleeve was first mounted on the roller by turning on the air to supply air to an outer surface of the roller, sliding the adapter sleeve over the roller, and turning the air supply off. The compressible adapter sleeve used was a soft foam slip fit adapter with 330 mm repeat supplied by the company Rotec. The cylindrically-shaped photosensitive element was mounted by sliding the element over the platform member and the roller such that the element has one or more unsupported parts between the roller and the platform member. An actuator moved the platform member away from the roller until the cylindrical element was tensioned between the platform member and the roller. In the tensioned position, the cylindrical element was extended and held relatively taut into contact against the outer surface of the platform member and the outer surface of the roller opposite the platform member. Water was transported through a cavity of the platform member and the roll to pre-heat and control the surface temperature of the cylindrical support. A radiant heater was turned on to heat the exterior surface of the cylindrical photosensitive element. The radiant heater may preheat the bulbs before the element was near the heater, and then switch to an operating setting to achieve the desired temperature for melting the composition layer on the element. The heater in the hot roll was turned on to warm the outer surface of the hot roll to the desired developing temperature. A motor of the carriage assembly was turned on to move the carriage and position the exterior surface of the element into pressure contact with the development medium residing on the hot roller. Servomotors in both the roller and the hot roll were turned on. The cylindrical photosensitive element began its rotation about the platform member and the roller, and the continuous web transported through the nip rotating with the hot roll at the same or substantially the same linear speed as the photosensitive element. The composition layer of the photosensitive element was heated to temperature indicated while in contact with the development medium. The tension for the development medium was adjusted in a way that the web separated from the outer surface of the photosensitive element directly after the nip. The absorbent material of the development medium contacted the exterior surface of the composition layer of the heated photosensitive element, and removed the liquefied portions of the elastomeric polymer from the unirradiated (uncured) portions of the composition layer, forming a flexographic printing form in which portions were removed to form a relief pattern or surface. By maintaining more or less intimate contact of the development medium with the composition layer that was molten in the uncured regions, a transfer of the uncured photosensitive material from the photopolymerizable layer to the development medium occurred. Intimate contact of the development medium to the photopolymerizable layer was maintained by pressing the layer and the development medium together. The development medium was removed immediately after traversing the nip area. The cylindrical photosensitive element continuously rotated about the platform member and the roller during thermal development to continuously cycle through heating the element, contacting the web to the element, and removing the web from the element. The cycle of the steps of heating the composition layer, contacting the molten (portions) layer with the development medium, and removing the development medium was repeated eight times to adequately remove the uncured material from the composition layer and create sufficient relief depth.

All tests in Example 1 were run with a surface temperature of 165° C. for the heated roller and a surface temperature of 40° C. for the compressible slip fit adapter as well as the platform member. The contact between the photosensitive element and the development medium as well as the heat input were adjusted by impression, speed and IR output setting for the eight individual cycles.

The tests conducted were as follows:

Test Development Medium 1 pre-laminated web of non-woven and PET (off-line)
  Control non-woven absorbent web only
2 Independent supply of each nonwoven and PET For Test 1 the development medium of nonwoven and PET that was laminated together was threaded into the apparatus described above. The tension for the development medium had been adjusted for immediate separation from the photopolymer surface directly after the nip. During the test the absorbent medium did not stretch or neck-in, nor did the absorbent material travel with the sleeve for some extent but separated nicely after the nip.

As a Control, the nonwoven polyester web only was threaded into the above described apparatus without changing the setting for web tension. At the start of the thermal development process, the nonwoven web immediately necked in very strongly (more than 3 cm on each side) and finally ruptured. The web was rethreaded, and the process restarted by significantly reducing the initial tension in the web until necking in was in the range of about 0.5-1 cm on each side. The thermal development process was completed, but occasionally the web stuck and traveled with the sleeve to some extent before separation occurred.

For Test 2, the development medium was threaded into the apparatus so that the nonwoven web and the PET web were separately delivered to the nip, where the two webs would laminate together, and then would travel together to a windup roll. The nonwoven web was the same as was used in the Control test. The web tracking was adjusted and the web tension increased again to the same level as used in Test 1. Thermal development of a sleeve proceeded well without stretching or necking in of the web. Separation of web and photopolymer element surface occurred nicely directly after the nip. After the process was completed, the adhesion between the nonwoven and PET was checked. Even after the last cycle, the two webs were stuck to each other with quite high force indicating that the polymer removed from the sleeve element actually functioned as a glue to laminate the two webs together.

Example 2

The following example demonstrates the effect of the laminated development medium on the formation of the relief surface in a flexographic printing form.

Three CYREL® flexographic printing plates, type 67 FD1, were exposed on a CYREL® 2001 Exposure Unit at the following conditions of 120 sec (2.6 J/cm$^2$) for back exposure (through support), and 8 min (10.4 J/cm$^2$) main exposure through a mask. The plates were processed on a commercial Cyrel®FASTTD1000 Thermal Developer using the standard processing conditions for 67 FD1 plates, but using a different development medium. The development medium was in contact with a hot roller heated to 325° F. One of the plates was developed using the standard CYREL®FAST developer roll, Cerex® nylon nonwoven (from Cerex Advanced Fabrics, from Pensacola, Fla.), which is the Control plate. The remaining two plates were thermally developed using a laminate of the CYREL®FAST developer roll nonwoven and a 12 micron (~0.5 mil) polyester film. The nonwoven and polyester film were laminated together offline between two rollers at 70° C. A 2-part polyurethane adhesive (from Henkel Corp.; hardener type 6067, adhesive type 7768) was applied between the nonwoven and the polyester film just prior to lamination.

The laminated development medium was fed in the processor so that the nonwoven side contacted an exterior surface of the plate, and the polyester film side was opposite the exterior surface. The polyester film side of the development medium contacted the hot roll.

The mask image exposed on the plate consisted of image elements of a series of solid rectangles 1 inch wide by 5 inch long (2.54 cm by 12.7 cm) separated by 1 inch (2.54 cm) bands of floor area. Across each 30 inch (76.2 cm) plate there were 14 solid bars with floor area between them and slightly wider floor bands along either edge. Ahead of and following this set of image elements was an area with no image across the width of the plate. After the plates were developed, the relief was measured between each rectangle. Additionally, the relief was measured across the width of the plate in the non-image areas. The averages of the measurements for the relief (in inches) in floor areas and between the blocks were as follows.

| Relief Depth (inch) | Control | Laminate | Difference |
|---|---|---|---|
| Floor | 0.0304 | 0.0311 | 0.0007 |
| Between blocks | 0.0266 | 0.0285 | 0.0019 |
| Blocks as % of floor | 87.3% | 91.5% | 4.2% |

The plates developed with the laminated material showed marginally higher relief overall, but more significant improvements was found in the relief area between the blocks. The relief uniformity (deviation between the relief in floor areas and between image elements) was improved by the use of the laminated development medium that showed 8.5% variation while the control sample showed 12.7%.

Example 2A

Samples of development medium were tested for modulus of elasticity and yield point under load according to ASTM D5035, at room temperature and at 150° C. The samples of development medium tested were not from the same rolls as described above for Example 2, but were representative of the development medium. The development medium tested were standard CYREL®FAST developer roll, Cerex® nylon nonwoven (from Cerex Advanced Fabrics, from Pensacola, Fla.), and a laminate of the CYREL®FAST developer roll nonwoven and a 12 micron (~0.5 mil) polyester film, prepared as described in Example 2.

The samples were tested on an Instron tensilometer (Test frame: Instron Model #1125, serial # 6571 Canton, Mass.; Load cell: Instron Catalogue #2511-105 serial # 580 (2000 lb tensile load cell); Grips: Standard Instron high temperature grips; Oven: United Calibration Corp. Huntington Beach, Calif., Model #UEC.3.5-1000, serial #18701). Test conditions were according to ASTM D5035 with 3 inch samples, 1 inch wide, with a process speed of 12 inch/minute. Testing at the elevated temperature was accomplished using the oven on the Instron equipment. Five samples of each development medium were tested, and the average is reported in the following table. Modulus of elasticity is reported as 1000 psi (ksi) and yield point at load is reported as pounds force per inch (lbf/in).

|  | Modulus of Elasticity (ksi) at room temperature | Modulus of Elasticity (ksi) at 150° C. | Yield Point (lbf/in) at room temperature | Yield Point (lbf/in) at 150° C. |
|---|---|---|---|---|
| Nylon nonwoven | 7.52 | 2.63 | 10.14 | 11.51 |
| Laminate of nylon non woven & polyester film | 10.23 | 3.04 | 14.98 | 19.99 |
| % increase | 36% | 15% | 48% | 74% |

The results demonstrated that the combination of an absorbent material (i.e., non woven) and a support (i.e., polyester film) provided improved mechanical strength as determined by the modulus of elasticity and yield point, compared to the absorbent material alone. The improvement in mechanical strength by the combination of absorbent material and support was observed at room temperature and at an elevated temperature, such as that experienced during thermal development.

What is claimed is:

1. A method for removing material from a photosensitive element having an exterior surface and containing a composition layer capable of being partially liquefied, comprising:

heating the exterior surface to a temperature sufficient to cause a portion of the layer to liquefy;

providing a development medium to the exterior surface, the development medium comprising an absorbent material that contacts the exterior surface and is under tension in a direction parallel to the exterior surface; and pressing the development medium and the exterior surface into contact at a pressure sufficient for at least a portion of the liquefied material to be removed by the absorbent material;

wherein the development medium further comprises a flexible support adjacent the absorbent material and opposite the exterior surface that is under tension in a direction parallel to the exterior surface.

2. The method of claim 1 further comprising providing relative movement between the development medium and the photosensitive element.

3. The method of claim 1 further comprising providing relative movement between the development medium and a contact member that supports the development medium.

4. The method of claim 3 wherein the contact member has a cross-sectional shape selected from the group consisting of elliptical, parabolic, arcuate, circular, semi-circular, wedge, triangular, rectangular, and polygonal shapes.

5. The method of claim 1 wherein the providing of the development medium further comprises assembling the absorbent material and the support at a nip between the exterior surface and a contact member supporting the development medium.

6. The method of claim 1 wherein the providing of the development medium further comprises assembling the absorbent material and the support at a location prior to a nip between the exterior surface and a contact member supporting the development medium.

7. The method of claim 1 further comprising forming the development medium by laminating the absorbent material and the support.

8. The method of claim 7 wherein the forming of the development medium is offline.

9. The method of claim 7 wherein the forming of the development medium is during the pressing step.

10. The method of claim 1 wherein the providing of the development medium comprises supplying the absorbent material as a first web and supplying the support as a second web, to form a web of the development medium prior to pressing.

11. The method of claim 10 further comprising collecting the web of the absorbent material on a first take-up roll and collecting the web of the support on a second take-up roll.

12. The method of claim 10 further comprising collecting the web of the development material on a take-up roll.

13. The method of claim 1 wherein the providing of the development medium comprises supplying the absorbent material as a web and supplying the support as a continuous loop about a contact member.

14. The method of claim 13 wherein the supplying of the absorbent material is to the contact member and the continuous loop support has at least a portion of a side opposite absorbent material engaging the contact member.

15. The method of claim 1 wherein the development medium is a monolithic structure of the absorbent material and the support.

16. The method of claim 1 wherein the development medium is a continuous web.

17. The method of claim 1 wherein the support is selected from the group consisting of polymeric films, papers, metals, fabrics, nonwovens, and combinations thereof.

18. The method of claim 1 wherein the support is selected from the group consisting of cellulosic films, polyolefin films, polycarbonate films, and polyester films.

19. The method of claim 1 wherein the support is selected from the group consisting of polyethylene terephthalate films and polyethylene naphthalate.

20. The method of claim 1 wherein the absorbent material is selected front the group consisting of non-woven materials, fibrous woven materials, paper stocks, porous materials, open-celled foams, and combinations thereof.

21. The method of claim 1 wherein the absorbent material is selected. from the group consisting of non-woven nylon and non-woven polyester.

22. The method of claim 1 wherein the development medium further comprises a second absorbent material adjacent a side of the support opposite the absorbent material.

23. The method of claim 1 wherein the development medium further comprises an adhesive material between the absorbent material and the support.

24. The method of claim 1 wherein the support reduces stretching or distorting of the absorbent material while pressing the development medium into contact with the exterior surface.

25. The method of claim 1 wherein the support reduces stretching or distorting of the absorbent material while the absorbent material is under tension after pressing the development medium and the exterior surface into contact.

26. The method of claim 1 wherein the development medium has a modulus of elasticity sufficient to reduce stretching of the absorbent material while the absorbent material is contacting the exterior surface.

27. The method of claim 1 wherein the absorbent material has a modulus of elasticity and the development medium has a modulus of elasticity that is greater than the modulus of elasticity of the absorbent material.

28. The method of claim 27 wherein the modulus of elasticity of the development medium is at least 10% greater than the modulus of elasticity of the absorbent material, at the temperature sufficient to cause the portion of the layer to liquefy.

29. The method of claim 27 wherein the modulus of elasticity of the development medium is at least 25% greater than the modulus of elasticity of the absorbent material, at the temperature sufficient to cause the portion of the layer to liquefy.

30. The method of claim 27 wherein the modulus of elasticity of the development medium is at least 10% greater than the modulus of elasticity of the absorbent material, at room temperature.

31. The method of claim 1 wherein the absorbent material has a yield point and the development medium has a yield point that is greater than the yield point of the absorbent material.

32. The method of claim 1 wherein the absorbent material has a yield point and the development medium has a yield point that is at least 10% greater than the yield point of the absorbent material.

33. The method of claim 1 wherein the absorbent material is a nonwoven and the support is polyethylene terephthalate film that forms the development medium having a modulus of elasticity of at least 10,000 psi, at room temperature.

34. The method of claim 1 wherein development medium is a web and the absorbent material is under tension of at least 0.1 lbs/k (0,2 Newtons/cm).

35. The method of claim 1 wherein the development medium is a web under tension of at least 0.3 lbs/in (0.5 Newtons/cm).

36. The method of claim 1 wherein the development medium is a web under tension of 0.3 to 5 lbs/in (0.5 to 8.8 Newtons/cm).

37. The method of claim 1 further comprising repeating the steps of heating, providing, and pressing at least once more.

38. The method of claim 1 further comprising removing the liquefied material with the absorbent material.

39. The method of claim 1 wherein the support is nonporous.

40. The method of claim 1 wherein the support has a thickness between about 0.01 and 0.38 mm.

41. The method of claim 1 further comprising supporting the photosensitive element on a second member.

42. The method of claim 38 wherein the second member is selected from the group consisting of a drum, two or more rolls, a platform member having a cross-sectional arcuate shape, and a planar surface.

43. The method of claim 1 further comprising separating the development medium from the exterior surface.

44. The method of claim 1 wherein the heating is at or adjacent to the pressing of the development medium and the exterior surface into contact.

45. The method of claim 1 wherein the heating step is selected from the group consisting of:
 a first heating which applies heat to the exterior surface of the composition layer adjacent where the absorbent material contacts the layer;
 a second heating to heat a first member to a temperature capable of heating the exterior surface of the composition layer while the absorbent material is contacting the exterior surface of the layer;
 a third heating to heat a second member to a temperature capable of heating the exterior surface of the composition layer;
 a combination of the first heating and the second heating;
 a combination of the first heating and the third heating;
 a combination of the second heating and the third heating; and
 a combination of the first heating, the second heating and the third heating.

46. The method of claim 1 further comprising imagewise exposing the photosensitive element to actinic radiation prior to the heating step.

47. The method of claim 1 further comprising:
 providing the development medium on a contact member to form a nip between the contact member and the exterior surface with the development medium therebetween.

48. The method of claim 47 further comprising after the pressing step, separating the development medium from the exterior surface,
 wherein the support remains adjacent the absorbent material from the nip to the separating of the development medium from the exterior surface.

* * * * *

UNITED STATES PATENT AND TRADEMARK OFFICE
CERTIFICATE OF CORRECTION

| | | |
|---|---|---|
| PATENT NO. | : 7,358,026 B2 | Page 1 of 1 |
| APPLICATION NO. | : 11/227520 | |
| DATED | : April 15, 2008 | |
| INVENTOR(S) | : Dudek Dietmar et al. | |

It is certified that error appears in the above-identified patent and that said Letters Patent is hereby corrected as shown below:

In column 5, line 42 delete "IS".

Signed and Sealed this

Eighteenth Day of November, 2008

JON W. DUDAS
*Director of the United States Patent and Trademark Office*